United States Patent
Wu et al.

(10) Patent No.: US 11,211,301 B2
(45) Date of Patent: Dec. 28, 2021

(54) SEMICONDUCTOR DEVICE AND METHOD OF MANUFACTURE

(71) Applicant: TAIWAN SEMICONDUCTOR MANUFACTURING COMPANY LIMITED, Hsin-Chu (TW)

(72) Inventors: Chunting Wu, Kaohsiung (TW); Ching-Hou Su, Hsinchu (TW); Chih-Pin Wang, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 45 days.

(21) Appl. No.: 16/787,097

(22) Filed: Feb. 11, 2020

(65) Prior Publication Data

US 2021/0249321 A1 Aug. 12, 2021

(51) Int. Cl.
| H01L 21/00 | (2006.01) |
| H01L 23/31 | (2006.01) |
| H01L 23/00 | (2006.01) |
| H01L 21/768 | (2006.01) |
| H01L 21/02 | (2006.01) |
| H01L 21/56 | (2006.01) |
| H01L 23/29 | (2006.01) |

(52) U.S. Cl.
CPC .... *H01L 23/3171* (2013.01); *H01L 21/02274* (2013.01); *H01L 21/56* (2013.01); *H01L 21/76892* (2013.01); *H01L 23/291* (2013.01); *H01L 23/3192* (2013.01); *H01L 24/11* (2013.01); *H01L 24/13* (2013.01); *H01L 2924/181* (2013.01)

(58) Field of Classification Search
CPC ....... H01L 23/3171; H01L 24/11; H01L 24/13
See application file for complete search history.

(56) References Cited

U.S. PATENT DOCUMENTS

| 5,756,390 A | * | 5/1998 | Juengling | H01L 21/76202 |
| | | | | 257/E21.552 |
| 6,027,999 A | * | 2/2000 | Wong | G02F 1/1345 |
| | | | | 257/737 |
| 7,355,279 B2 | * | 4/2008 | Ke | H01L 24/11 |
| | | | | 257/737 |
| 7,666,779 B2 | * | 2/2010 | Ke | H01L 24/11 |
| | | | | 438/614 |
| 8,552,560 B2 | * | 10/2013 | Bhatt | H05K 1/0271 |
| | | | | 257/758 |
| 9,224,678 B2 | * | 12/2015 | Chen | H01L 21/56 |
| 9,373,604 B2 | * | 6/2016 | Yu | H01L 21/6835 |

(Continued)

FOREIGN PATENT DOCUMENTS

| JP | 2016154252 A | 8/2016 |
| KR | 20160062827 A | 6/2016 |

*Primary Examiner* — Laura M Menz
(74) *Attorney, Agent, or Firm* — Cooper Legal Group, LLC

(57) ABSTRACT

A semiconductor device includes a first conductive feature and a second conductive feature. A first passivation layer is positioned between the first conductive feature and the second conductive feature. A second passivation layer is positioned between the first conductive feature and the second conductive feature and over the first passivation layer. A lowermost portion of an interface where the first passivation layer contacts the second passivation layer is positioned below 40% or above 60% of a height of the first conductive feature.

20 Claims, 5 Drawing Sheets

(56) References Cited

U.S. PATENT DOCUMENTS

| | | | |
|---|---|---|---|
| 9,379,075 B2 * | 6/2016 | Chen | H01L 24/11 |
| 9,401,308 B2 * | 7/2016 | Chen | H01L 24/08 |
| 9,406,632 B2 * | 8/2016 | Wang | H01L 23/3128 |
| 9,543,259 B2 * | 1/2017 | Chiang | H01L 24/03 |
| 9,799,601 B1 | 10/2017 | Hsu et al. | |
| 10,015,888 B2 * | 7/2018 | Chen | H05K 3/281 |
| 10,229,880 B2 * | 3/2019 | Rivero | H01L 21/31111 |
| 10,685,896 B2 * | 6/2020 | Liu | H01L 23/3128 |
| 10,755,995 B2 * | 8/2020 | Wang | H01L 21/02211 |
| 10,756,040 B2 * | 8/2020 | Yu | H01L 24/05 |
| 10,861,829 B2 * | 12/2020 | Fung | H01L 23/481 |
| 10,957,664 B2 * | 3/2021 | Wu | H01L 24/03 |
| 2005/0218476 A1 * | 10/2005 | Lee | H01L 23/5258 |
| | | | 257/529 |
| 2014/0117534 A1 | 5/2014 | Liu et al. | |
| 2016/0149086 A1 | 5/2016 | Sim et al. | |
| 2017/0141051 A1 | 5/2017 | Yu et al. | |

\* cited by examiner

SEMICONDUCTOR DEVICE AND METHOD OF MANUFACTURE

BACKGROUND

Contacts are used to make electrical connections in or among different features in a semiconductor device. A contact, for example, is used to connect one metal layer to another metal layer or another device layer, where the metal layers are otherwise electrically isolated from one another, such as by a dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
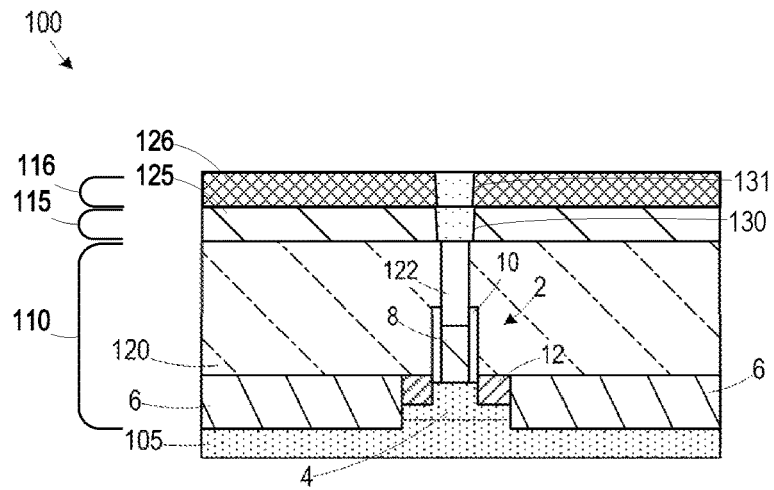
FIGS. 1-10 are illustrations of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor device are provided herein. In some embodiments, a multiple-stage deposition process is performed to form a dielectric blocking structure comprising multiple passivation layers between adjacent conductive features. Metal shrinkage in the conductive features induces tensile strain in a region between the conductive features. In some embodiments, the passivation layers are deposited in such a manner so as to provide interfaces between the passivation layers that are not positioned in a stress concentration zone where the tensile stress is highest. It has been discovered that, in some embodiment, the stress concentration zone where the tensile stress is highest corresponds to a region extending from about 40% of the height of the conductive features to about 60% of the height of the conductive features. In some embodiments, the interfaces between the passivation layers are positioned lower than 40% or higher than 60% of the height of the conductive features.

Turning to FIG. 1, a plurality of layers used in the formation of a semiconductor device 100 are illustrated, in accordance with some embodiments. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon. In some embodiments, the plurality of layers comprises a device layer 110, a first metallization layer 115, and a second metallization layer 116. In some embodiments, the device layer 110 comprises integrated circuit elements, such as a FinFET transistor 2. In some embodiments, the device layer 110 includes other circuit elements such as planar transistors, capacitors, resistors, or other suitable devices, which are not individually illustrated. In some embodiments, the first metallization layer 115 and the second metallization layer 116 represent routing layers for routing electrical signals between layers of the semiconductor device 100 positioned under the first metallization layer 115 and layers of the semiconductor device 100 positioned over the first metallization layer 115 and the second metallization layer 116, such as a under bump metallurgy (UBM) layer. In some embodiments, one or more additional metallization layers are formed between the device layer 110 and the first metallization layer 115. Thus, the first metallization layer 115 may be an M1 layer (i.e., a first metallization layer closest to the device layer 110) or an Mx layer, where x is in integer greater than or equal to 2. In some embodiments, one or more additional metallization layers are formed over the second metallization layer 116.

In some embodiments, a fin 4 is formed in the semiconductor layer 105 by etching trenches in the semiconductor layer 105 using a patterned hard mask. Thus, the fin 4 is formed from the semiconductor layer 105. In some embodiments, the fin 4 is formed, such as grown, over the semiconductor layer 105. In general, the fin 4 defines an active region for forming devices, such as the FinFET transistor 2. In some embodiments, an isolation structure 6, such as shallow trench isolation (STI), is formed adjacent the FinFET transistor 2 to isolate the FinFET transistor 2 from adjacent devices by forming a recess in the semiconductor layer 105 and filling the recess with a dielectric material. In some embodiments, the isolation structure 6 comprises silicon oxide or other suitable materials.

In some embodiments, a gate structure 8 is formed over the fin 4. According to some embodiments, the gate structure 8 is formed by forming a sacrificial gate structure comprising a sacrificial gate dielectric layer, a sacrificial polysilicon layer, and a hard mask layer over the fin 4 and the isolation structure 6. In some embodiments, a patterning process is performed to pattern the hard mask layer corresponding to the pattern of gate structures to be formed, and an etch process is performed using the patterned hard mask layer to etch the sacrificial polysilicon layer and the sacrificial gate dielectric layer to define the sacrificial gate structure. In some embodiments, remaining portions of the hard mask layer form a cap layer over the sacrificial gate structure. In some embodiments, the sacrificial gate structure is later replaced with the gate structure 8 comprising a gate dielectric layer and a gate electrode (not separately shown).

In some embodiments, the gate dielectric layer comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2. In some embodiments, the gate dielectric layer comprises a native oxide layer formed by exposure of the semiconductor device 100 to oxygen at various points in the process flow, causing the formation of silicon dioxide on exposed surfaces of the fin 4. In some embodiments, an additional layer of dielectric material, such as silicon dioxide, a high-k dielectric material, or other suitable material, is formed over the native oxide to form the gate dielectric layer.

In some embodiments, the gate electrode comprises a barrier layer, one or more work function material layers, a seed layer, a metal fill layer, or other suitable layers. In some embodiments, the metal fill layer comprises tungsten (W) or other suitable material. In some embodiments, the replacement gate dielectric layer and the one or more layers of the gate electrode are deposited by at least one of atomic layer deposition (ALD), physical vapor deposition (PVD), chemical vapor deposition (CVD), or other suitable processes.

In some embodiments, a sidewall spacer 10 is formed adjacent the gate structure 8. In some embodiments, the sidewall spacer 10 is formed by depositing a spacer layer over the gate structure 8 and performing an anisotropic etch process to remove horizontal portions of the spacer layer. In some embodiments, the sidewall spacer 10 comprises silicon nitride or other suitable materials.

In some embodiments, source/drain regions 12 are formed in the fin 4 after forming the gate structure 8. For example, in some embodiments, portions of the fin 4 are doped through an implantation process to form source/drain regions 12 in the fin 4. In some embodiments, an etch process is performed to recess the fin 4 adjacent the sidewall spacer 10 and an epitaxial growth process is performed to form the source/drain regions 12.

In some embodiments, the device layer 110 comprises a first dielectric layer 120. In some embodiments, the first dielectric layer 120 comprises silicon dioxide or a low-k material. In some embodiments, the first dielectric layer 120 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the materials for the first dielectric layer 120 comprise at least one of Si, O, C, or H, such as SiCOH and SiOC, or other suitable materials. Organic material such as polymers may be used for the first dielectric layer 120. In some embodiments, the first dielectric layer 120 comprises one or more layers of a carbon-containing material, organo-silicate glass, a porogen-containing material, or combinations thereof. The first dielectric layer 120 comprises nitrogen in some embodiments. In some embodiments, the first dielectric layer 120 is formed by using, for example, at least one of plasma-enhanced CVD (PECVD), low pressure CVD (LPCVD), atomic layer CVD (ALCVD), or a spin-on technology.

In some embodiments, a gate contact 122 is formed in the first dielectric layer 120 to contact the gate structure 8 or a gate electrode of the gate structure 8. In some embodiments, the gate contact 122 is formed by using a patterned etch mask to etch a recess in the first dielectric layer 120 to expose the gate structure 8 and forming a conductive material in the recess. In some embodiments, the conductive material comprises tungsten, aluminum, copper, cobalt, or other suitable material. In some embodiments, the gate contact 122 comprises a plurality of layers, such as a barrier layer, a seed layer, and a conductive fill layer.

In some embodiments, the first metallization layer 115 comprises a second dielectric layer 125. In some embodiments, the second dielectric layer 125 comprises silicon dioxide or a low-k material. In some embodiments, the second dielectric layer 125 comprises one or more layers of low-k dielectric material. In some embodiments, the materials for the second dielectric layer 125 comprise at least one of Si, O, C, or H, such as SiCOH and SiOC, or other suitable materials. Organic material such as polymers may be used for the second dielectric layer 125. In some embodiments, the second dielectric layer 125 comprises one or more layers of a carbon-containing material, organo-silicate glass, a porogen-containing material, or combinations thereof. The second dielectric layer 125 comprises nitrogen in some embodiments. In some embodiments, the second dielectric layer 125 is formed by using, for example, at least one of PECVD, LPCVD, ALCVD, or a spin-on technology. In some embodiments, the second dielectric layer 125 comprises a same material composition as the first dielectric layer 120. In some embodiments, an etch stop layer may be formed between the first dielectric layer 120 and the second dielectric layer 125 to provide etch control when forming a conductive feature 130 as described below. In some embodiments, the material composition of the second dielectric layer 125 is selected to have a different etch selectivity relative to the first dielectric layer 120. In some such embodiments, the second dielectric layer 125 can directly contact the first dielectric layer 120.

In some embodiments, a first conductive feature 130 is positioned in the second dielectric layer 125 contacting the gate contact 122. In some embodiments, the first conductive feature 130 comprises a metal. In some embodiments, the metal comprises tungsten, aluminum, copper, cobalt, or other suitable material. In some embodiments, the first conductive feature 130 comprises a silicide material. In some embodiments, the first conductive feature 130 comprises a plurality of layers, such as a barrier layer, a seed layer, and a conductive fill layer. In some embodiments, the first conductive feature 130 comprises a line feature having, in a horizontal plane, a width (extending left and right on the page) and an axial length (extending into and out of the page) greater than the width. In some embodiments, the first conductive feature 130 comprises a via feature having, in a horizontal plane, a width-to-length ratio less than about 5. In some embodiments, the first conductive feature 130 is formed using a damascene process by using a patterned etch mask to etch a recess in the second dielectric layer 125 and filling the recess with a material of the first conductive feature 130. In some embodiments, the material of the first conductive feature 130 overfills the recess and a planarization process is performed to remove portions outside the recess. In some embodiments, the planarization process comprises a chemical mechanical planarization (CMP) process.

In some embodiments, the second metallization layer 116 comprises a third dielectric layer 126. In some embodiments, the third dielectric layer 126 comprises silicon dioxide or a low-k material. In some embodiments, the third dielectric layer 126 comprises one or more layers of low-k dielectric material. In some embodiments, the materials for the third dielectric layer 126 comprise at least one of Si, O, C, or H, such as SiCOH and SiOC, or other suitable materials. Organic material such as polymers may be used for the third dielectric layer 126. In some embodiments, the third dielectric layer 126 comprises one or more layers of a carbon-containing material, organo-silicate glass, a porogen-containing material, or combinations thereof. The third dielectric layer 126 comprise nitrogen in some embodiments. In some embodiments, the third dielectric layer 126 is formed by using, for example, at least one of PECVD, LPCVD, ALCVD, or a spin-on technology. In some embodiments, the third dielectric layer 126 comprises a same material composition as at least one of the first dielectric layer 120 or the second dielectric layer 125. In some embodiments, an etch stop layer may be formed between the second dielectric layer 125 and the third dielectric layer 126 to provide etch control when forming a conductive feature 131 as described below. In some embodiments, the material composition of the third dielectric layer 126 is selected to have a different etch selectivity relative to the second dielectric layer 125. In some such embodiments, the third dielectric layer 126 can directly contact the second dielectric layer 125.

In some embodiments, a second conductive feature 131 is positioned in the third dielectric layer 126 contacting the first conductive feature 130. In some embodiments, the second conductive feature 131 comprises a metal. In some embodiments, the metal comprises tungsten, aluminum, copper, cobalt, or other suitable material. In some embodiments, the second conductive feature 131 comprises a silicide material. In some embodiments, the second conductive feature 131 comprises a same material composition as the first conductive feature 130. In some embodiments, the second conductive feature 131 comprises a plurality of layers, such as a barrier layer, a seed layer, and a conductive fill layer. In some embodiments, the second conductive feature 131 comprises a line feature having, in a horizontal plane, a width (extending left and right on the page) and an axial length (extending into and out of the page) greater than the width. In some embodiments, the second conductive feature 131 comprises a via feature having, in a horizontal plane, a width-to-length ratio less than about 5. In some embodiments, the second conductive feature 131 is formed using a damascene process by using a patterned etch mask to etch a recess in the third dielectric layer 126 and filling the recess with a material of the second conductive feature 131. In some embodiments, the material of the second conductive feature 131 overfills the recess and a planarization process is performed to remove portions outside the recess. In some embodiments, the planarization process comprises a chemical mechanical planarization (CMP) process.

Figure 2:
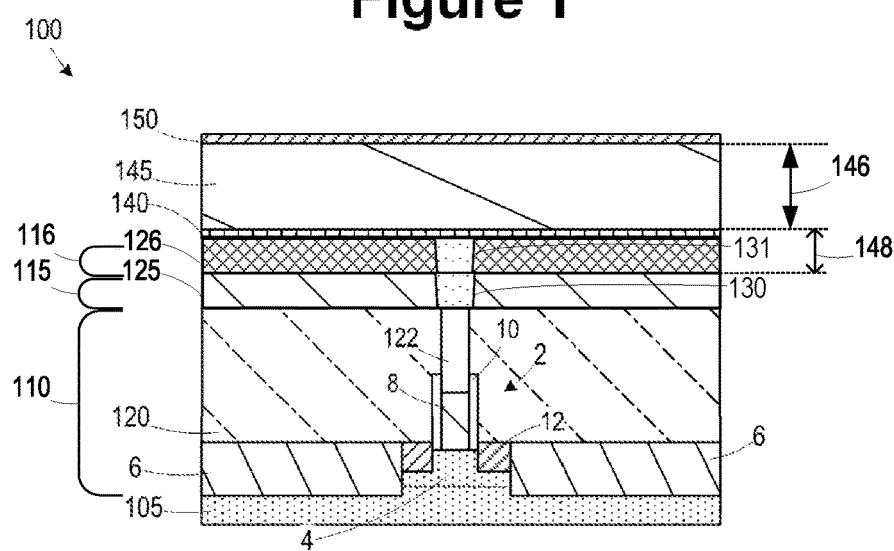

Referring to FIG. 2, a glue layer 140 is formed over the third dielectric layer 126 and the second conductive feature 131, a conductive layer 145 is formed over the glue layer 140, and a hard mask layer 150 is formed over the conductive layer 145, in accordance with some embodiments. In some embodiments, the glue layer 140 comprises TaO, TiO, TiN, or other suitable material. In some embodiments, the glue layer 140 is formed by at least one of CVD, LPCVD, PECVD, ultra-high vacuum CVD (UHVCVD), reduced pressure CVD (RPCVD), ALD, PVD, pulsed laser deposition, sputtering, evaporative deposition, vapor phase epitaxy (VPE), molecular beam epitaxy (MBE), liquid phase epitaxy (LPE), or other suitable techniques. In some embodiments, the conductive layer 145 comprises tungsten, aluminum, or other suitable material. In some embodiments, the conductive layer 145 is formed to have a height 146 greater than or equal to 20 kilo Angstroms. In some embodiments, a ratio between a height 148 of at least one of the first conductive feature 130 or the second conductive feature 131 to the height 146 of the conductive layer 145 is between about 5,000 Angstroms and about 10,000 Angstroms or between about 7,000 Angstroms and about 8,500 Angstroms. In some embodiments, the conductive layer 145 is formed by at least one of CVD, ALD, PVD, pulsed laser deposition, sputtering, evaporative deposition, electroplating, electroless plating, or other suitable techniques. In some embodiments, the hard mask layer 150 comprises silicon nitride or other suitable materials.

Figure 3:
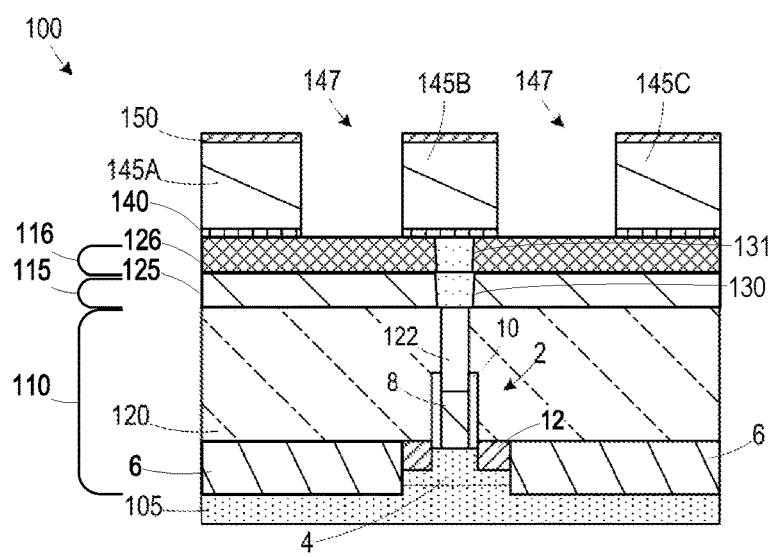

Referring to FIG. 3, the hard mask layer 150 and the conductive layer 145 are patterned, in accordance with some embodiments. In some embodiments, conductive features 145A, 145B, 145C are defined from the conductive layer 145 by the patterning. In some embodiments, the conductive features 145A, 145B, 145C comprise line features. In some embodiments, the line features have an axial length running into the page in the illustration of FIG. 3. In some embodiments, recesses 147 are defined between the conductive features 145A, 145B, 145C due to the patterning of the conductive layer 145. In some embodiments, at least one of the conductive features 145A, 145B, 145C overlies the second conductive feature 131.

In some embodiments, the hard mask layer 150 and the conductive layer 145 are patterned using a subtractive etch process by forming one or more layers of a photolithography stack or other suitable etch process. In some embodiments where a photolithography stack is formed, the photolithography stack comprises a bottom antireflective coating (BARC) layer formed over the hard mask layer 150. In some embodiments, the BARC layer is a polymer layer that is applied using a spin coating process. In some embodiments, the photolithography stack comprises an organic planarization layer (OPL) formed over the BARC layer. In some embodiments, the OPL layer comprises a photo-sensitive organic polymer that is applied using a spin coating process. In some embodiments, the OPL layer comprises a dielectric layer. In some embodiments, the photolithography stack comprises a photoresist layer over the OPL layer. In some embodiments, the photoresist layer comprises an electromagnetic radiation sensitive material and properties, such as solubility, of the photoresist layer are affected by electromagnetic radiation. The photoresist layer is either a negative photoresist or a positive photoresist. In some embodiments, portions of the OPL layer are also irradiated by the electromagnetic radiation that patterns the photoresist layer to change the etch selectivity of the irradiated portions of the OPL layer with respect to non-irradiated portions. In some embodiments, the photoresist layer is exposed using a radiation source and a reticle to define a pattern in the photoresist layer. In some embodiments, portions of the photoresist layer are removed to define a patterned photoresist layer. In some embodiments, the underlying OPL layer and BARC layer are etched using the patterned photoresist layer as a template to form a patterned mask over the hard mask layer 150, and an etch process is performed to pattern the hard mask layer 150. In some embodiments, the photolithography stack is removed and an etch process is performed using the patterned hard mask layer 150 to etch the conductive layer 145 to define the conductive features 145A, 145B, 145C.

In some embodiments, the glue layer 140 is etched by the etch process used to etch the conductive layer 145 or by another, subsequent etch process to expose a top surface of the third dielectric layer 126. In some embodiments, the glue layer 140 is not etched or is merely partially etched and the top surface of the third dielectric layer 126 is not exposed.

Figure 4:
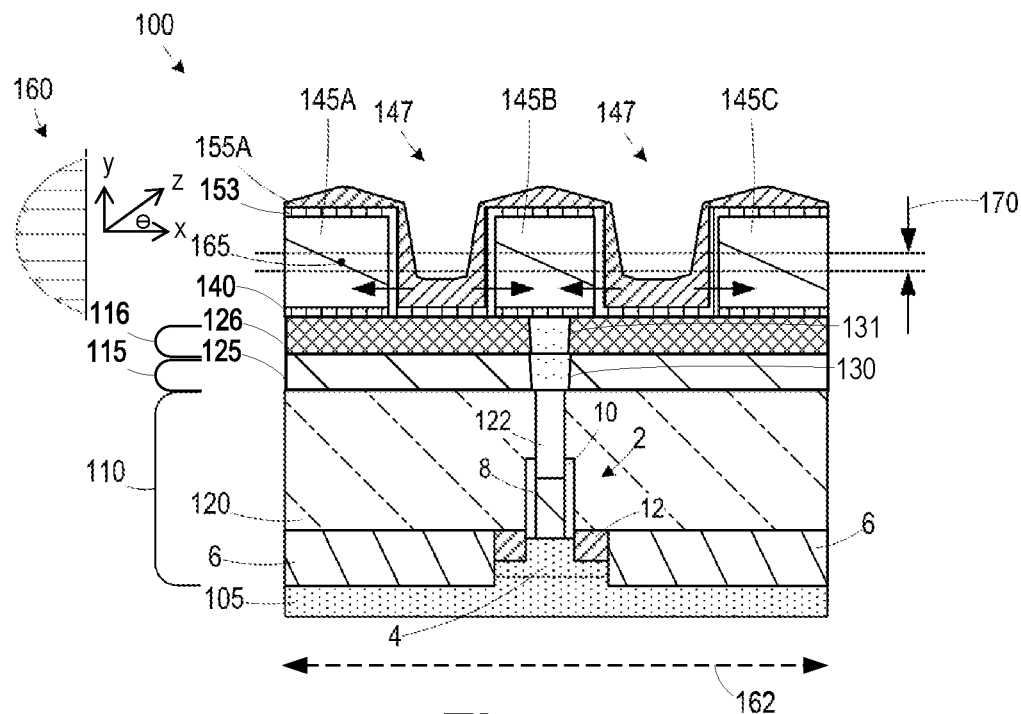

Referring to FIG. 4, the hard mask layer 150 is removed, an encapsulation layer 153 is formed over the conductive features 145A, 145B, 145C, and a first passivation layer 155A is formed over the encapsulation layer 153, in accordance with some embodiments. In some embodiments, the encapsulation layer 153 and the first passivation layer 155A are formed within the recesses 147 defined between respective conductive features 145A, 145B, 145C. In some embodiments, the encapsulation layer 153 is adjacent sidewall surfaces of the conductive features 145A, 145B, 145C. In some embodiments, the encapsulation layer 153 is formed such that sidewalls of the first passivation layer 155A positioned within the recesses 147 are spaced apart from sidewalls of the conductive features 145A, 145B, 145C by the encapsulation layer 153. In some embodiments, the encapsulation layer 153 is formed such that bottom surfaces of the first passivation layer 155A positioned within the recesses 147 are spaced apart from the top surface of the third dielectric layer 126 by the encapsulation layer 153. In some embodiments, the encapsulation layer 153 comprises SiN, TaN, TiN, or other suitable material. In some embodiments, the encapsulation layer 153 is formed by at least one of CVD, ALD, PVD, pulsed laser deposition, sputtering, evaporative deposition, electroplating, electroless plating, or other suitable techniques. In some embodiments, the encapsulation layer 153 has a thickness of between about 1 nm and 5 nm.

In some embodiments, the encapsulation layer 153 is omitted. In some embodiments, an etch process is performed after the encapsulation layer 153 is formed and before the first passivation layer 155A is formed. For example, in some embodiments, a horizontal surface of the encapsulation layer 153 adjacent the glue layer 140 is removed prior to the first passivation layer 155A being formed, and the first passivation layer 155A is formed to contact the top surface of the third dielectric layer 126. In some embodiments, the hard mask layer 150 is not removed before the encapsulation layer 153 or the first passivation layer 155A are formed, and thus top surfaces of the conductive features 145A, 145B, 145C are spaced apart from the bottom surface of the encapsulation layer 153 by the hard mask layer 150.

In some embodiments, the first passivation layer 155A comprises silicon dioxide. In some embodiments, the first passivation layer 155A is formed using a high density plasma (HDP) process. In some embodiments, the HDP process uses precursor gases comprising silane ($SiH_4$), oxygen, and argon. In some embodiments, the HDP process comprises a deposition component, where material is formed on surfaces of the semiconductor arrangement, and a sputtering component, where deposited material is removed or relocated. In some embodiments, the sputtering component removes material from upper sidewalls of the recesses 147 and redeposits the material in lower regions of the recesses 147. In some embodiments, a deposition-to-sputtering ratio depends on gas ratios employed during the deposition. In some embodiments, argon and oxygen act as sputtering sources. In some embodiments, particular values of the gas ratios are determined based on an aspect ratio of the recesses 147. In some embodiments, the HDP process is performed at a temperature of about 350-450° C.

FIG. 4 includes a tensile stress curve 160 that illustrates stress along an X direction 162 resulting from shrinkage of the conductive features 145A, 145B, 145C due to temperature changes during fabrication or operation of the semiconductor device 100. In some embodiments, a coefficient of thermal expansion for the conductive features 145A, 145B, 145C is greater than a coefficient of thermal expansion for the first passivation layer 155A. In some embodiments, when the conductive features 145A, 145B, 145C shrink relative to adjacent materials, tensile stress is generated in X, Y, and Z directions. As illustrated in FIG. 4, the X direction 162 is horizontally oriented, the Y direction is vertically oriented, and the Z direction is oriented into the page. In some embodiments, the conductive feature 145A and the conductive feature 145B generate tensile stress in opposite directions as shown by arrows in FIG. 4. Likewise, the conductive feature 145B and the conductive feature 145C generate tensile stress in opposite directions shown by arrows in FIG. 4. As a result, the tensile stress in the X direction 162 exerted on the regions between the conductive features 145A, 145B, 145C is additive. In general, the tensile stress in the Y and Z directions is not additive.

According to some embodiments, the tensile stress in the X direction varies as a function of the angle, $\Theta$, from a center point 165 of the associated conductive feature 145A, 145B, 145C by the relationship:

$$\sigma(\Theta)=\sigma \cdot \cos(\Theta).$$

As the angle, $\Theta$, increases, the tensile stress in the X direction decreases. The tensile stress in the X direction is at a maximum value when $\Theta$ is zero, which represents the tensile stress in the X direction at the height of the center point 165. A stress concentration region 170 is defined between about 40% and 60% of the height of the conductive features 145A, 145B, 145C.

Figure 5:
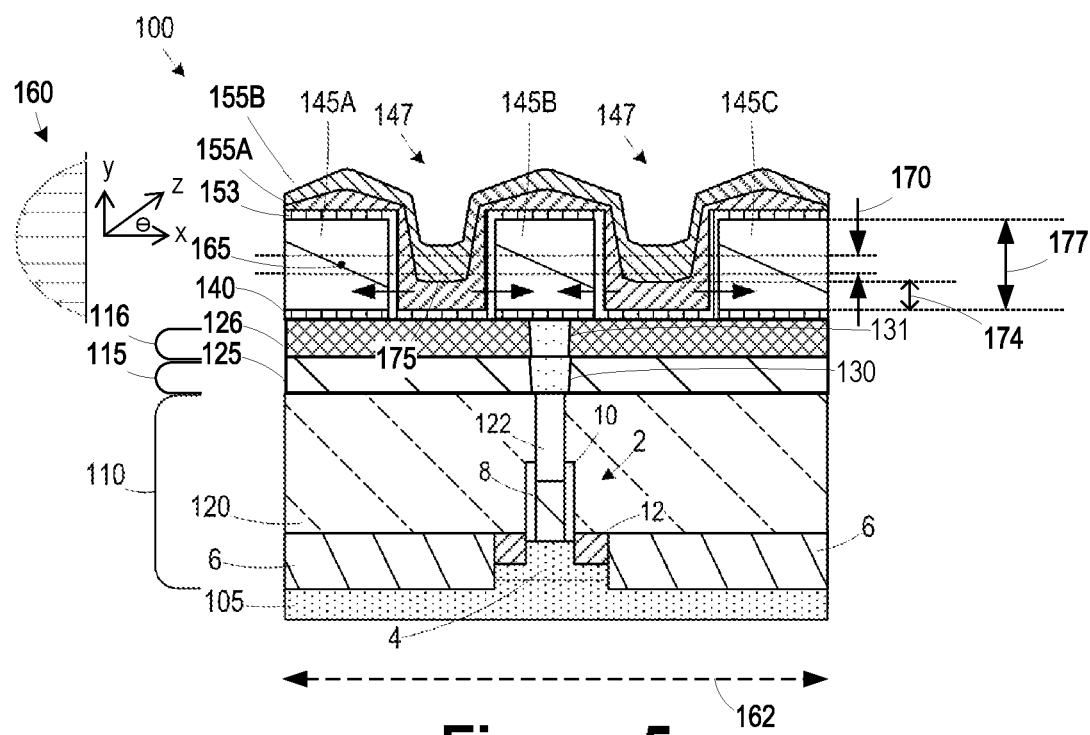

Referring to FIG. 5, a second passivation layer 155B is formed over the first passivation layer 155A, in accordance with some embodiments. In some embodiments, the second passivation layer 155B is the same material as the first passivation layer 155A. In some embodiments, the second passivation layer 155B is a different material than the first passivation layer 155A. In some embodiments, the second passivation layer 155B and first passivation layer 155A comprise silicon dioxide.

In some embodiments, the deposition parameters of the HDP process for forming the second passivation layer 155B are the same as the deposition parameters for forming the first passivation layer 155A. In some embodiments, the deposition parameters of the HDP process for forming the second passivation layer 155B are modified to change the deposition-to-sputtering ratio. In some embodiments, a thickness of the second passivation layer 155B is greater than a thickness of the first passivation layer 155A. In some embodiments, a deposition time of the HDP process during the formation of the second passivation layer 155B is increased relative to a deposition time of the HDP process during the formation of the first passivation layer 155A to provide the increased thickness of the second passivation layer 155B.

As seen in FIG. 5, a first interface 175 is defined between the first passivation layer 155A and the second passivation layer 155B, according to some embodiments. In some embodiments, the first interface 175 is positioned in a region between the conductive features 145A, 145B, 145C and is generally parallel to an upper surface of the semiconductor layer 105. In some embodiments, the first interface 175 represents the lowermost portion of the interface between the first passivation layer 155A and the second passivation layer 155B positioned between the conductive features 145A, 145B, 145C. In some embodiments, the first interface 175 is positioned outside the stress concentration region 170. In some embodiments, the first interface 175 is positioned at a height less than 40% of the height 177 of the conductive features 145A, 145B, 145C. By way of example, in an embodiment where the height 177 of the conductive features 145A, 145B, 145C is about 30 kilo Angstroms, a height 174 of the first passivation layer 155A from a top surface of the glue layer 140 to where the lowermost portion of the first interface 175 between the first passivation layer 155A and the second passivation layer 155B is positioned may be about 10 kilo Angstroms, and thus the lowermost portion of the first interface 175 is positioned at a height of about 33% of the height 177 of the conductive features 145A, 145B, 145C. In some embodiments, the height 177 of the conductive features 145A, 145B, 145C is at least 20 kilo Angstroms.

Figure 6:
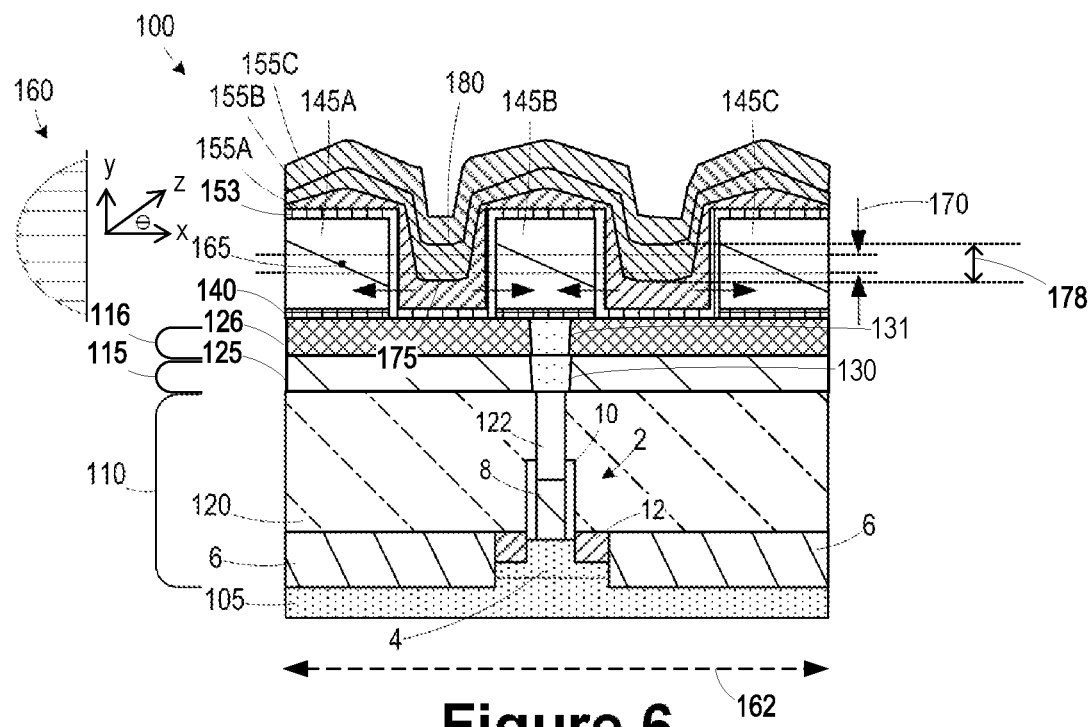

Referring to FIG. 6, a third passivation layer 155C is formed over the second passivation layer 155B, in accordance with some embodiments. In some embodiments, the third passivation layer 155C is the same material as the second passivation layer 155B. In some embodiments, the third passivation layer 155C is the same material as the first passivation layer 155A. In some embodiments, the third passivation layer 155C is a different material than at least one of the second passivation layer 155B or the first passivation layer 155A. In some embodiments, the first passivation layer 155A, the second passivation layer 155B, and the third passivation layer 155C comprise silicon dioxide.

In some embodiments, the deposition parameters for forming the third passivation layer 155C are the same as the deposition parameters for forming the second passivation layer 155B. In some embodiments, the deposition parameters for forming the third passivation layer 155C are modified to change the deposition-to-sputtering ratio. In some embodiments, the thickness of the third passivation layer 155C is greater than the thickness of the second passivation layer 155B. In some embodiments, the deposition time of the HDP process is increased relative to the deposition time of the HDP process during the formation of the second passivation layer 155B to provide the increased thickness of the third passivation layer 155C.

As seen in FIG. 6, a second interface 180 is defined between the second passivation layer 155B and the third passivation layer 155C, according to some embodiments. In some embodiments, the second interface 180 is positioned in a region between the conductive features 145A, 145B, 145C and is generally parallel to an upper surface of the semiconductor layer 105. In some embodiments, the second interface 180 represents the lowermost portion of the interface between the second passivation layer 155B and the third passivation layer 155C positioned between the conductive features 145A, 145B, 145C. In some embodiments, the second interface 180 is positioned outside the stress concentration region 170. In some embodiments, the second interface 180 is positioned at a height greater than 60% of the height of the conductive features 145A, 145B, 145C. By way of example, in an embodiment where the height 177 of the conductive features 145A, 145B, 145C is about 30 kilo Angstroms and the height 174 of the first passivation layer 155A from a top surface of the glue layer 140 to where the lowermost portion of the first interface 175 between the first passivation layer 155A and the second passivation layer 155B is positioned is about 10 kilo Angstroms, a height 178 of the second passivation layer 155B from the lowermost portion of the first interface 175 between the first passivation layer 155A and the second passivation layer 155B to the lowermost portion of the second interface 180 between the second passivation layer 155B and the third passivation layer 155C may be about 10-15 kilo Angstroms. Thus, in such an example, the lowermost portion of the second interface 180 is positioned at a height of about 66% to about 83% of the height 177 of the conductive features 145A, 145B, 145C.

According to some embodiments, providing the first interface 175 and the second interface 180 outside the stress concentration region 170 mitigates the formation of stress cracks in the passivation layers 155A, 155B, 155C, 155D between the conductive features 145A, 145B, 145C. In some embodiments, a different number of passivation layers 155A, 155B, 155C, 155D is employed. In some embodiments, no lowermost portions of interfaces between the passivation layers 155A, 155B, 155C, 155D or additional passivation layers, if present, are positioned in the stress concentration region 170.

Figure 7:
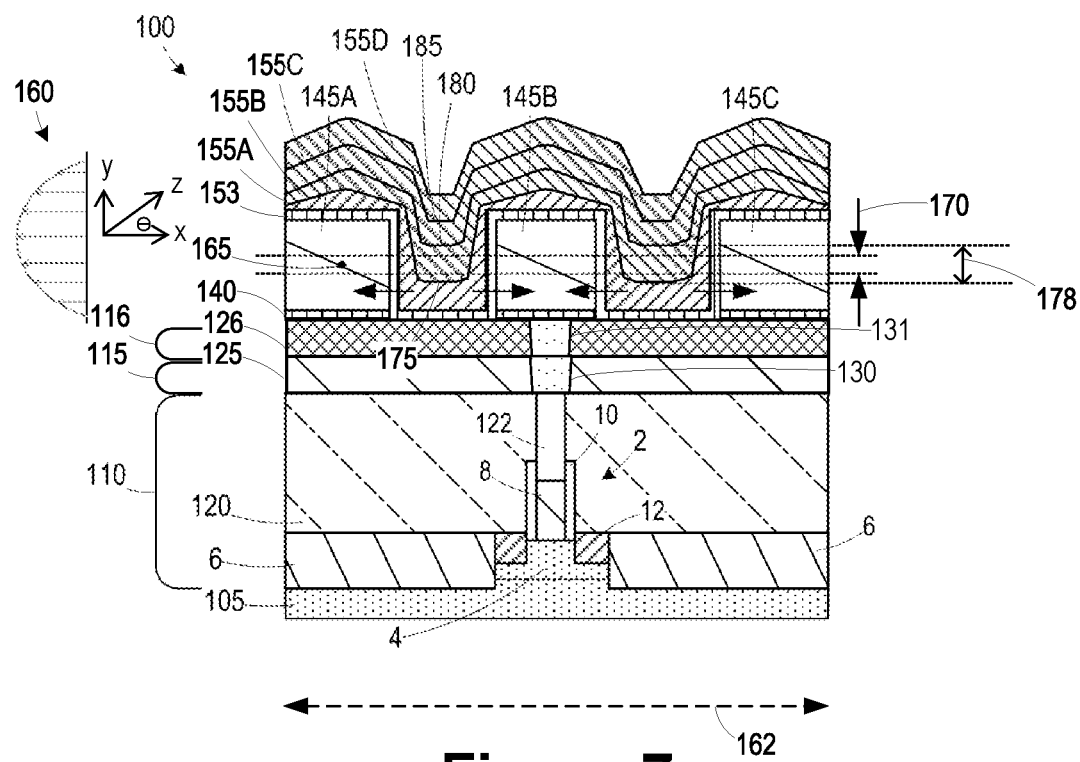

Referring to FIG. 7, a fourth passivation layer 155D is formed over the third passivation layer 155C, in accordance with some embodiments. In some embodiments, the fourth passivation layer 155D is the same material as at least one of the first passivation layer 155A, the second passivation layer 155B, or the third passivation layer 155C. In some embodiments, the fourth passivation layer 155D is a different material than at least one of the first passivation layer 155A, the second passivation layer 155B, or the third passivation layer 155C. In some embodiments, the first passivation layer 155A, the second passivation layer 155B, the third passivation layer 155C, and the fourth passivation layer 155D comprise silicon dioxide.

In some embodiments, the deposition parameters for forming the fourth passivation layer 155D are the same as the deposition parameters for forming the third passivation layer 155C. In some embodiments, the deposition parameters for forming the fourth passivation layer 155D are modified relative to the deposition parameters for forming the third passivation layer 155C to change the deposition-to-sputtering ratio. In some embodiments, the thickness of the fourth passivation layer 155D is different than the thickness of the third passivation layer 155C. In some embodiments, the deposition time of the HDP process is increased relative to the deposition time of the HDP process during the formation of the third passivation layer 155C to provide an increased thickness of the fourth passivation layer 155D relative to the thickness of the third passivation layer 155C.

As seen in FIG. 7, a third interface 185 is defined between the third passivation layer 155C and the fourth passivation layer 155D, according to some embodiments. In some embodiments, the third interface 185 is positioned in a region between the conductive features 145A, 145B, 145C and is generally parallel to an upper surface of the semiconductor layer 105. In some embodiments, the third interface 185 represents the lowermost portion of the interface between the third passivation layer 155C and the fourth passivation layer 155D positioned between the conductive features 145A, 145B, and 145C. In some embodiments, the third interface 185 is positioned outside the stress concentration region 170. In some embodiments, the third interface 185 is positioned at or above a top surface of the conductive features 145A, 145B, 145C. In some embodiments, the third interface 185 is positioned below a top surface of the conductive features 145A, 145B, 145C.

Figure 8:
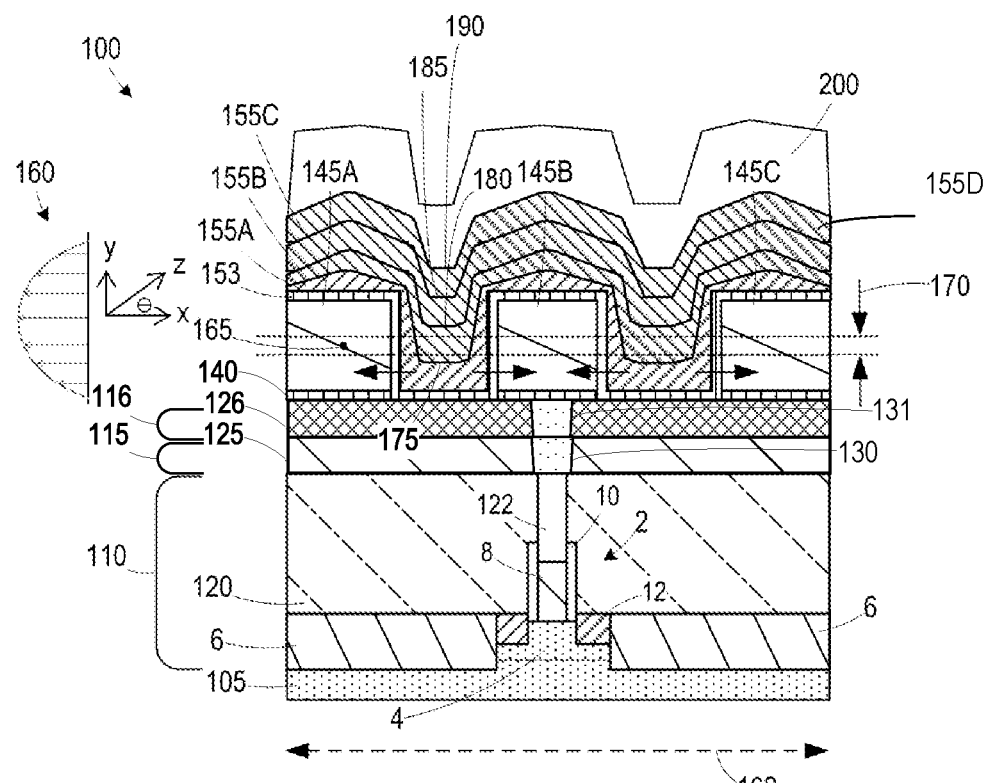

Referring to FIG. 8, a nitride layer 200 is formed over the fourth passivation layer 155D, in accordance with some embodiments. In some embodiments, the materials for the nitride layer 200 comprise at least one of silicon nitride (SIN) or silicon oxynitride (SION). In some embodiments, the nitride layer 200 is formed by using, for example, at least one of PECVD, LPCVD, ALCVD, or a spin-on technology. In some embodiments, the nitride layer 200 at least one of prevents or decreases exposure of the integrated circuit elements to moisture, prevents or decreases mechanical damage to the integrated circuit elements, or prevents or decreases radiation damage to the integrated circuit elements.

As seen in FIG. 8, a fourth interface 190 is defined between the fourth passivation layer 155D and the nitride layer 200, according to some embodiments. In some embodiments, the fourth interface 190 is positioned in a region between the conductive features 145A, 145B, 145C and is generally parallel to an upper surface of the semiconductor layer 105. In some embodiments, the fourth interface 190 represents the lowermost portion of the interface between the fourth passivation layer 155D and the nitride layer 200 positioned between the conductive features 145A, 145B, and 145C. In some embodiments, the fourth interface 190 is positioned outside the stress concentration region 170. In some embodiments, the fourth interface 190 is positioned at or above a top surface of the conductive features 145A, 145B, 145C. In some embodiments, the fourth interface 190 is positioned below a top surface of the conductive features 145A, 145B, 145C.

Figure 9:
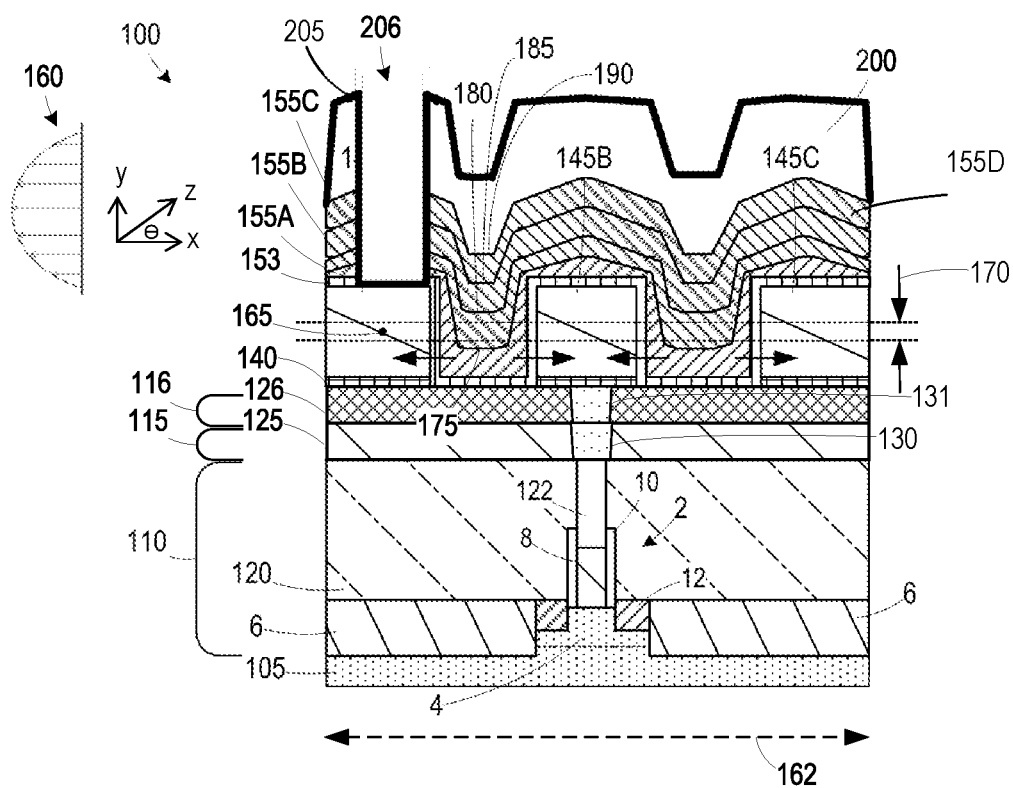

Referring to FIG. 9, photolithography and etching are performed to remove a portion of the nitride layer 200, a portion of the fourth passivation layer 155D, a portion of the third passivation layer 155C, a portion of the second passivation layer 155B, a portion of the first passivation layer 155A, and a portion of the encapsulation layer 153 to define a recess 206, and an under bump metallurgy (UBM) layer 205 is formed in the recess 206 and over the nitride layer 200, in accordance with some embodiments. In some embodiments, a top surface of the conductive feature 145A is exposed through the recess 206. In some embodiments, the UBM layer 205 contacts the conductive feature 145A. In some embodiments, the UBM layer 205 comprises multiple layers of conductive materials, such as at least one of a layer of titanium, a layer of copper, or a layer of nickel. In some embodiments, at least one layer of the UBM layer 205 is formed using a plating process, such as electrochemical plating, although other processes of formation, such as sputtering, evaporation, or electroless plating process, may be used depending upon the materials to be used.

Figure 10:
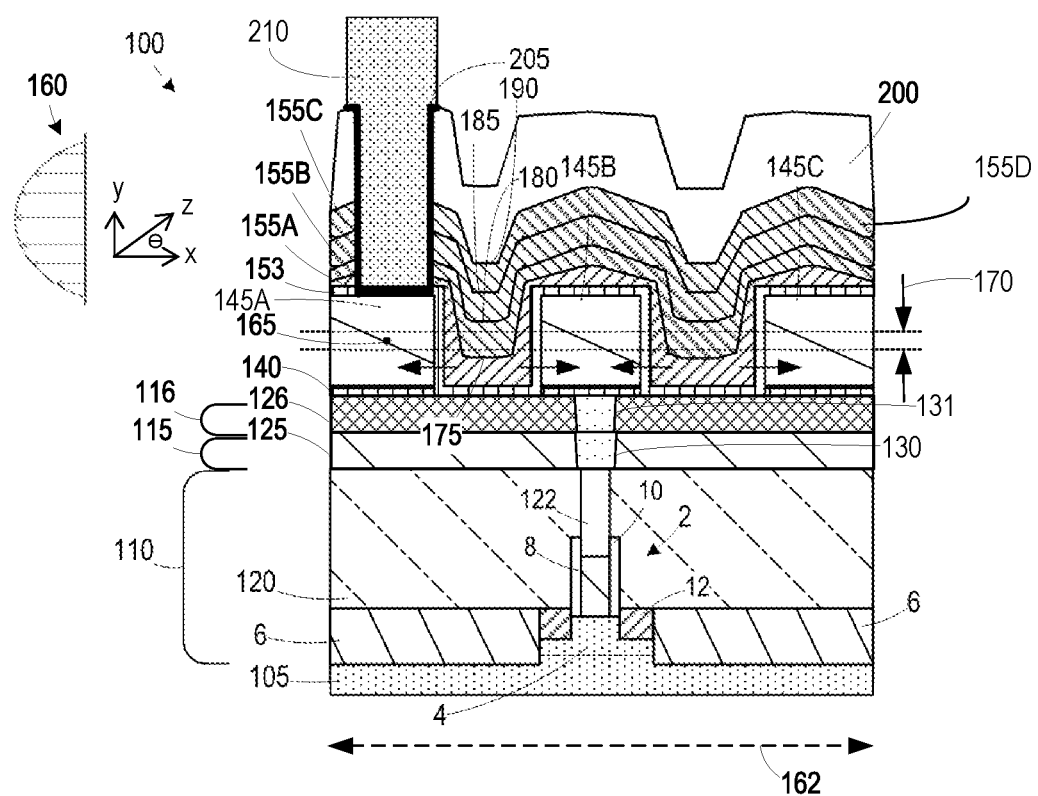

Referring to FIG. 10, a conductive pillar 210 is formed over the UBM layer 205, in accordance with some embodiments. In some embodiments, a conductive material is deposited in the recess 206 by evaporation, electroplating, or screen printing to form the conductive pillar 210 over the UBM layer 205. In some embodiments, the conductive material comprises any of a variety of metals or metal alloys, such as solder, copper, etc. In some embodiments, a portion of the UBM layer 205 not covered by the conductive pillar 210 is removed by an etching process that etches exposed portions of the UBM layer 205 to expose the nitride layer 200. In some embodiments, a remaining portion of the UBM layer 205 under the conductive pillar 210 is disposed adjacent to sidewalls of the nitride layer 200, the fourth passivation layer 155D, the third passivation layer 155C, the second passivation layer 155B, the first passivation layer 155A, and the encapsulation layer 153 defining the recess 206. In some embodiments, the UBM layer 205 is disposed between a top surface of the nitride layer 200 and the conductive pillar 210. In some embodiments, the conductive pillar 210 is a copper pillar. In some embodiments, the conductive pillar 210 is a solder pillar, wherein the solder is reflown by heating to form a solder bump.

In some embodiments, metal shrinkage in the conductive features 145A, 145B, 145C induces tensile stress in a stress concentration region 170 between the conductive features. In some embodiments, passivation layers 155A, 155B, 155C, 155D are deposited in such a manner so as to provide interfaces 175, 180, 185 between the passivation layers 155A, 155B, 155C, 155D that are not positioned in the stress concentration region 170 where the tensile stress is highest. It has been discovered that, in some embodiments, the stress concentration region 170 where the tensile stress is highest corresponds to a region extending from about 40% of the height of the conductive features 145A, 145B, 145C to about 60% of the height of the conductive features 145A, 145B, 145C. In some embodiments, the interfaces 175, 180, 185 between the passivation layers 155A, 155B, 155C, 155D are positioned lower than 40% or higher than 60% of the height of the conductive features 145A, 145B, 145C.

In some embodiments, a semiconductor device includes a first conductive feature and a second conductive feature. A first passivation layer is positioned between the first conductive feature and the second conductive feature. A second passivation layer is positioned between the first conductive feature and the second conductive feature and over the first passivation layer. A lowermost portion of an interface where the first passivation layer contacts the second passivation layer is positioned below 40% or above 60% of a height of the first conductive feature.

In some embodiments, the semiconductor device includes an encapsulation layer over the first conductive feature and the second conductive feature. The first passivation layer is positioned over the encapsulation layer.

In some embodiments, the semiconductor device includes a nitride layer over the second passivation layer and an under bump metallurgy (UBM) layer extending through the nitride layer.

In some embodiments, the semiconductor device includes an under bump metallurgy (UBM) layer in contact with a sidewall of the second passivation layer.

In some embodiments, the semiconductor device includes an under bump metallurgy (UBM) layer extending through the second passivation layer and the first passivation layer and in contact with at least one of the first conductive feature or the second conductive feature.

In some embodiments, the first passivation layer and the second passivation layer have a same material composition.

In some embodiments, a semiconductor device includes a first conductive feature and a second conductive feature. A first passivation layer is positioned between the first conductive feature and the second conductive feature. A second passivation layer is positioned between the first conductive feature and the second conductive feature and over the first passivation layer. A third passivation layer is positioned between the first conductive feature and the second conductive feature and over second passivation layer. A lowermost portion of an interface where the first passivation layer contacts the second passivation layer is positioned below 40% of a height of the first conductive feature. A lowermost portion of an interface where the second passivation layer contacts the third passivation layer is positioned above 60% of the height of the first conductive feature.

In some embodiments, the first passivation layer, the second passivation layer, and the third passivation layer include a same material composition.

In some embodiments, the first passivation layer, the second passivation layer, and the third passivation layer include silicon dioxide.

In some embodiments, the semiconductor device includes an encapsulation layer over the first conductive feature and the second conductive feature. The first passivation layer is positioned over the encapsulation layer.

In some embodiments, the semiconductor .device includes a nitride layer over the third passivation layer and an under bump metallurgy (UBM) layer extending through the nitride layer, the third passivation layer, the second passivation layer, and the first passivation layer to contact at least one of the first conductive feature or the second conductive feature.

In some embodiments, the semiconductor device includes a fourth passivation layer over the third passivation layer.

In some embodiments, the semiconductor device includes a nitride layer over the third passivation layer.

In some embodiments, the first conductive feature and the second conductive feature include metal.

In some embodiments, a method of forming a semiconductor device includes forming a conductive layer and removing a portion of the conductive layer to define a recess between a first conductive feature formed from the conductive layer and a second conductive feature formed from the conductive layer. A first passivation layer is formed in the recess between the first conductive feature and the second conductive feature. A second passivation layer is formed in the recess between the first conductive feature and the second conductive feature and over the first passivation layer. A lowermost portion of an interface where the first passivation layer contacts the second passivation layer is positioned below 40% or above 60% of a height of the first conductive feature.

In some embodiments, at least one of forming the first passivation layer or forming the second passivation layer includes performing a high density plasma deposition process.

In some embodiments, the method of forming the semiconductor device includes forming a third passivation layer in the recess between the first conductive feature and the second conductive feature and over the second passivation layer. The lowermost portion of the interface where the first passivation layer contacts the second passivation layer is positioned below 40% of the height of the first conductive feature. A lowermost portion of an interface where the second passivation layer contacts the third passivation layer is positioned above 60% of the height of the first conductive feature.

In some embodiments, the method of forming the semiconductor device includes forming an encapsulation layer over the first conductive feature and the second conductive feature. The first passivation layer is positioned over the encapsulation layer.

In some embodiments, the method of forming the semiconductor device includes etching the second passivation layer and the first passivation layer to define a second recess and forming an under bump metallurgy (UBM) layer in the second recess.

In some embodiments, the first passivation layer and the second passivation layer include a same material composition The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a first conductive feature;
a second conductive feature;
a first passivation layer positioned between the first conductive feature and the second conductive feature; and
a second passivation layer positioned between the first conductive feature and the second conductive feature and over the first passivation layer, wherein a lowermost portion of an interface where the first passivation layer contacts the second passivation layer is positioned below 40% or above 60% of a height of the first conductive feature.

2. The semiconductor device of claim 1, comprising:
an encapsulation layer over the first conductive feature and the second conductive feature, wherein the first passivation layer is positioned over the encapsulation layer.

3. The semiconductor device of claim 1, comprising:
a nitride layer over the second passivation layer; and
an under bump metallurgy (UBM) layer extending through the nitride layer.

4. The semiconductor device of claim 1, comprising:
an under bump metallurgy (UBM) layer in contact with a sidewall of the second passivation layer.

5. The semiconductor device of claim 1, comprising:
an under bump metallurgy (UBM) layer extending through the second passivation layer and the first passivation layer and in contact with at least one of the first conductive feature or the second conductive feature.

6. The semiconductor device of claim 1, wherein the first passivation layer and the second passivation layer have a same material composition.

7. A semiconductor device, comprising:
a first conductive feature;
a second conductive feature;
a first passivation layer positioned between the first conductive feature and the second conductive feature;
a second passivation layer positioned between the first conductive feature and the second conductive feature and over the first passivation layer; and
a third passivation layer positioned between the first conductive feature and the second conductive feature and over second passivation layer, wherein:
a lowermost portion of an interface where the first passivation layer contacts the second passivation layer is positioned below 40% of a height of the first conductive feature, and
a lowermost portion of an interface where the second passivation layer contacts the third passivation layer is positioned above 60% of the height of the first conductive feature.

8. The semiconductor device of claim 7, wherein the first passivation layer, the second passivation layer, and the third passivation layer comprise a same material composition.

9. The semiconductor device of claim 7, wherein the first passivation layer, the second passivation layer, and the third passivation layer comprise silicon dioxide.

10. The semiconductor device of claim 7, comprising:
an encapsulation layer over the first conductive feature and the second conductive feature, wherein the first passivation layer is positioned over the encapsulation layer.

11. The semiconductor device of claim 7, comprising:
a nitride layer over the third passivation layer; and
an under bump metallurgy (UBM) layer extending through the nitride layer, the third passivation layer, the second passivation layer, and the first passivation layer to contact at least one of the first conductive feature or the second conductive feature.

12. The semiconductor device of claim 7, comprising a fourth passivation layer over the third passivation layer.

13. The semiconductor device of claim 7, comprising:
a nitride layer over the third passivation layer.

14. The semiconductor device of claim 7, wherein the first conductive feature and the second conductive feature comprise metal.

15. A semiconductor device, comprising:
a first conductive feature electrically coupled to a gate of a transistor;
a first passivation layer having a first portion disposed on a first side of the first conductive feature and a second portion disposed on a second side of the first conductive feature; and
a second passivation layer having a first portion disposed on the first side of the first conductive feature and a second portion disposed on the second side of the first conductive feature, wherein a lowermost portion of an interface where the first portion of the first passivation layer contacts the first portion of the second passivation layer is positioned below 40% or above 60% of a height of the first conductive feature.

16. The semiconductor device of claim 15, comprising a third passivation layer having a first portion disposed on the first side of the first conductive feature and a second portion disposed on the second side of the first conductive feature, wherein a lowermost portion of an interface where the first portion of the second passivation layer contacts the first portion of the third passivation layer is positioned above 60% of the height of the first conductive feature.

17. The semiconductor device of claim 15, wherein the first passivation layer and the second passivation layer overlie the first conductive feature.

18. The semiconductor device of claim 15, comprising:
an encapsulation layer between the first passivation layer and the first conductive feature.

19. The semiconductor device of claim 18, comprising:
a glue layer, wherein the encapsulation layer and the first conductive feature contact the glue layer.

20. The semiconductor device of claim 19, wherein the first conductive feature overlies the glue layer.

* * * * *